United States Patent
Endresen et al.

(10) Patent No.: US 10,454,478 B2
(45) Date of Patent: Oct. 22, 2019

(54) COMMUNICATION BETWEEN INTEGRATED CIRCUITS

(71) Applicant: Nordic Semiconductor ASA, Trondheim (NO)

(72) Inventors: Vegard Endresen, Trondheim (NO); Per-Carsten Skoglund, Trondheim (NO); Steffen Wiken, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 15/569,722

(22) PCT Filed: Apr. 28, 2016

(86) PCT No.: PCT/GB2016/051196
§ 371 (c)(1),
(2) Date: Oct. 26, 2017

(87) PCT Pub. No.: WO2016/174432
PCT Pub. Date: Nov. 3, 2016

(65) Prior Publication Data
US 2018/0131375 A1    May 10, 2018

(30) Foreign Application Priority Data
Apr. 28, 2015 (GB) .................... 1507201.0

(51) Int. Cl.
*H03K 19/00* (2006.01)
*G06F 13/42* (2006.01)
*H03K 21/38* (2006.01)

(52) U.S. Cl.
CPC ..... *H03K 19/0021* (2013.01); *G06F 13/4282* (2013.01); *G06F 13/4291* (2013.01); *H03K 21/38* (2013.01)

(58) Field of Classification Search
None
See application file for complete search history.

(56) References Cited

U.S. PATENT DOCUMENTS 6,240,151 B1 * 5/2001 Ko .......................... H04L 25/38
375/370
6,266,710 B1 * 7/2001 Dittmer ............... G06F 13/4045
710/1

(Continued)

FOREIGN PATENT DOCUMENTS

CN  101398802 A1  4/2009
JP  63250759 A    10/1988

OTHER PUBLICATIONS

PCT International Search Report and Written Opinion for PCT/GB2016/051196, dated Jul. 7, 2016, 11 pages.

(Continued)

*Primary Examiner* — Henry Tsai
*Assistant Examiner* — Christopher A Bartels
(74) *Attorney, Agent, or Firm* — Klarquist Sparkman, LLP

(57) ABSTRACT

A serial, half-duplex start/stop event detection circuit comprises a stop detection flip-flop clocked by a serial data input that takes a serial clock input as an input and generates a stop signal output indicative of a stop event. A start detection flip-flop, clocked by an inverted copy of the serial data input, takes the serial clock input as an input and generates a start signal output indicative of a start event. A first buffer flip-flop, clocked by an inverted copy of the serial clock input, takes the start signal output as an input and generates a first delayed start signal output. Similarly, a second buffer flip-flop, clocked by the serial clock input, takes the first delayed start signal output as an input and generates a second delayed start signal output. The second delayed start (Continued)

signal output resets at least one of said stop detection, start detection or first buffer flip-flops.

18 Claims, 3 Drawing Sheets

(56) References Cited

U.S. PATENT DOCUMENTS

| | | | |
|---|---|---|---|
| 6,530,029 B1 | 3/2003 | Metchev | |
| 6,710,811 B1* | 3/2004 | Lin | H04L 7/0331 |
| | | | 348/465 |
| 7,127,538 B1* | 10/2006 | Nekl | G06F 13/4286 |
| | | | 710/106 |
| 7,417,877 B2* | 8/2008 | Leung | H02M 3/157 |
| | | | 323/282 |
| 7,913,012 B2* | 3/2011 | Piasecki | G06F 13/4208 |
| | | | 709/238 |
| 2002/0176009 A1* | 11/2002 | Johnson | H04N 5/335 |
| | | | 348/229.1 |
| 2008/0218389 A1* | 9/2008 | Yamagata | G09G 3/2096 |
| | | | 341/100 |
| 2009/0070514 A1* | 3/2009 | Moriyama | G05B 19/054 |
| | | | 710/311 |
| 2010/0149151 A1* | 6/2010 | Nam | G09G 3/3614 |
| | | | 345/211 |
| 2010/0153676 A1* | 6/2010 | Kawamura | H03K 19/17728 |
| | | | 711/170 |
| 2012/0075137 A1* | 3/2012 | Tanizawa | H03M 1/0621 |
| | | | 341/157 |
| 2014/0223158 A1* | 8/2014 | Zhou | G06F 9/4405 |
| | | | 713/2 |
| 2014/0247834 A1* | 9/2014 | Poulsen | H04L 7/0066 |
| | | | 370/458 |
| 2014/0312929 A1 | 10/2014 | Fullerton | |
| 2015/0009050 A1* | 1/2015 | Lahr | H03M 5/12 |
| | | | 341/70 |
| 2015/0081936 A1* | 3/2015 | Low | G06F 13/4282 |
| | | | 710/105 |
| 2015/0286606 A1* | 10/2015 | Sengoku | G06F 13/364 |
| | | | 710/110 |
| 2016/0050063 A1* | 2/2016 | Kiyomizu | H04L 7/044 |
| | | | 375/369 |
| 2017/0003807 A1* | 1/2017 | Abe | G06F 3/0416 |

OTHER PUBLICATIONS

UK Intellectual Property Office Search Report under Section 17 for GB1507201.0, dated Oct. 29, 2015, 3 pages.

Beer, "Robust I2C slave without a sampling clock," dlbeer Engineering, Aug. 25, 2011, 9 pages.

* cited by examiner

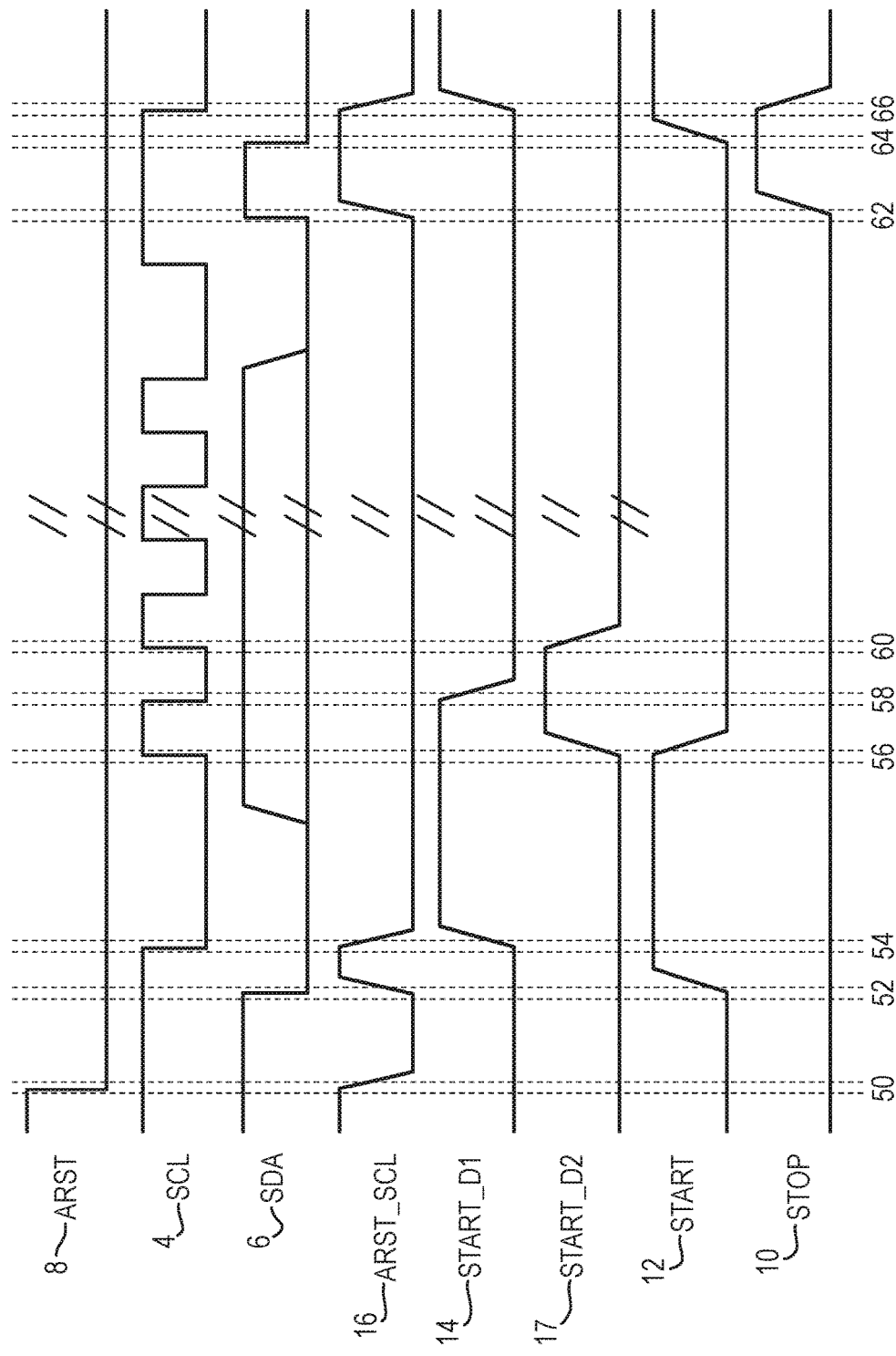

COMMUNICATION BETWEEN INTEGRATED CIRCUITS

CROSS REFERENCE TO RELATED APPLICATIONS

This is the U.S. National Stage of International Application No. PCT/GB2016/051196, filed Apr. 28, 2016, which was published in English under PCT Article 21(2), which in turn claims the benefit of Great Britain Application No. 1507201.0 filed Apr. 28, 2015.

Inter-integrated circuit, commonly referred to as IIC, I²C, or I2C, is a popular and well-established serial computer bus developed by Philips Semiconductor (now NXP Semiconductors), used for connecting low speed integrated circuits together. Such integrated circuits may exist within a single circuit on the same circuit board, or may be connected via a cable. The key feature of IIC is that it provides multi-master, multi-slave, single-ended communication, keeping circuit design relatively simple.

IIC provides serial, half-duplex communication, i.e. bits are sent one at a time in either direction along the bus, but only in one direction at any given time. An IIC bus requires only two bi-directional lines, namely the serial data line (SDA) and the serial clock line (SCL). Both SDA and SCL are open-drain and are pulled up to a logic high reference voltage (commonly +3.3 V or +5.0 V) using pull up resistors.

An IIC bus allows a node (i.e. a terminal connection at either end of the bus) to act as either a slave or a master. As the bus is multi-master and multi-slave, there can be any number of master and slave nodes at any given time, and these roles can change during operation.

In order to send a message (henceforth referred to as a transaction) from a master to a slave, the master first sends a special "START" bit sequence. After the desired data has been sent, the master then sends a special "STOP" bit sequence. It is important that the receiving IIC slave can accurately detect these START/STOP bit sequences.

Within the IIC protocol, a START bit sequence occurs when the serial data line undergoes a negative transition (i.e. from logic high to logic low) while the serial clock line is logic high. In contrast, a STOP bit sequence occurs when the serial data line undergoes a positive transition (i.e. from logic low to logic high) while the serial clock line is logic high.

Conventional IIC bus implementations utilise a sampling mechanism to poll the SDA and SCL lines to detect when a START or STOP bit sequence has been sent and determine the beginning and end of transactions accordingly. However, in order to determine these sequences accurately, the SDA and SCL lines need to be sampled at a relatively high frequency (usually double the data rate). Sampling SDA and SCL at such high frequencies requires a high frequency sampling clock, which undesirably increases the power requirements of the device.

There have been attempts in the art, an example of which is described in U.S. Pat. No. 6,530,029, to get around this issue by removing the need for a separate sampling clock, adding detection circuitry to IIC devices that can determine when a START or STOP bit sequence has been received. However, such detection circuits contain "unsafe constructs", such as flip-flops resetting their own inputs, which can lead to glitches and erroneous detections. Furthermore, the solution proposed in U.S. Pat. No. 6,530,029 requires set-reset (SR) flip-flops which can cause issues during implementation because of the complexity involved with having both set and reset inputs.

When viewed from a first aspect, the present invention provides a serial, half-duplex start/stop event detection circuit comprising:
  a serial data input;
  a serial clock input;
  a stop detection flip-flop clocked by the serial data input that takes the serial clock input as a stop data input and generates a stop signal output indicative of a stop event having been detected;
  a start detection flip-flop clocked by an inverted copy of the serial data input that takes the serial clock input as a start data input and generates a start signal output indicative of a start event having been detected;
  a first buffer flip-flop clocked by an inverted copy of the serial clock input that takes the start signal output as a first buffer data input and generates a first delayed start signal output; and
  a second buffer flip-flop clocked by the serial clock input that takes the first delayed start signal output as a second buffer data input and generates a second delayed start signal output, wherein
  the second delayed start signal output is arranged to reset at least one of said stop detection flip-flop, start detection flip-flop or first buffer flip-flop.

The Applicant has appreciated a solution that provides not only substantial power savings compared to conventional serial half-duplex start/stop event detection circuit implementations, but also uses only "safe constructs" that ensure that no glitches occur and that only one event such as a start or stop condition can exist at any one time.

Thus it will be appreciated by those skilled in the art that the present invention provides a stable method and device for detecting start and stop events without the need for a dedicated sampling clock. The start and stop detector flip-flops take the serial clock line as their data input and are clocked using the serial data line. This ensures that a start or stop event is only detected when the serial clock is logic high, and that the serial data line undergoes a negative or positive transition respectively.

Those skilled in the art will also appreciate that if bus issues occur, the circuit is self-recovering, minimising downtime and preventing the bus from becoming locked up.

Glitches on the bus can cause issues, particularly in multi-master arrangements, whereby a start or stop event that was previously determined as having been sent from one master may be invalidated by a glitch arising from a second master. The Applicant has appreciated that by ensuring that there is at least one additional flip-flop between any given flip-flop and a flip-flop it resets, no flip-flop resets its own data source and the serial half-duplex start/stop event detection circuit is stable and is self-recovering following a glitch on the bus.

In some sets of embodiments, the start signal output is set to logic high when the serial clock signal is high and the serial data signal transitions from logic high to logic low. In some sets of embodiments, the stop signal output is set to logic high when the serial clock signal is high and the serial data signal transitions from logic low to logic high.

In some sets of embodiments, the first and second buffer flip-flops are arranged as a shift register.

In some serial, half-duplex communication protocols, it is possible for multiple start events to occur with no intervening stop event. This is known as a repeated start or a restart event. Since typically the serial data line is not deterministic (i.e. it is impossible to know in advance when the next signal transition will occur), there is no way of knowing when the next transition will occur to cause the input of the start detector flip-flop (i.e. the serial clock line) to be passed to the output. The Applicant has appreciated that it is advantageous to reset the start detector flip-flop using a source that is clocked by the serial clock line in order to be able to detect restart events. Thus in some sets of embodiments, the second delayed start signal output resets the start detection flip-flop.

Additionally or alternatively, the first delayed start signal output resets the stop detection flip-flop. In some overlapping sets of embodiments, the stop signal output resets the second buffer flip-flop.

Thus it will be appreciated that in the embodiments outlined above, the internal signals can be used to reset the detection circuit each time a start or stop bit sequence is detected. Additionally or alternatively, in some sets of embodiments, an asynchronous reset signal input resets at least one flip-flop within the serial half-duplex start/stop event detection circuit. This advantageous arrangement provides an additional reset mechanism whereby the entire detection circuit can be reset by an external trigger. In some further sets of embodiments, an asynchronous reset input of the start detection flip-flop is connected to a start reset OR gate that takes the asynchronous reset signal input and the second delayed start signal output as inputs. Additionally or alternatively, in some sets of embodiments, an asynchronous reset input of the stop detection flip-flop is connected to a stop reset OR gate that takes the asynchronous reset signal input and the first delayed start signal output as inputs. Additionally or alternatively, in some sets of embodiments, an asynchronous reset input of the second buffer flip-flop is connected to a second buffer reset OR gate that takes the asynchronous reset signal input and the stop signal output as inputs. Additionally or alternatively, in some sets of embodiments, the asynchronous reset signal input is connected directly to an asynchronous reset input of the first buffer flip-flop.

In some sets of embodiments, the serial half-duplex start/stop event detection circuit is implemented in an IIC device. In such embodiments, the start and stop signals referred to above correspond to the START and STOP signals as defined within the IIC protocol respectively. It will be appreciated by those skilled in the art that the present invention is also applicable to the system management bus (SMBus) protocol due to the extensive similarities with IIC.

The serial half-duplex start/stop event detection circuit may exist as a self-contained module that provides the necessary start and stop signal outputs for implementing a serial half duplex communication device such as an IIC slave device. However, in some sets of embodiments, the serial half-duplex start/stop event detection circuit produces an asynchronous reset signal output. This additional output allows the detection circuit to trigger a reset of the external circuitry within the rest of the serial half-duplex communication device. In some sets of embodiments, the asynchronous reset signal output is set to logic high when the stop signal output and/or the asynchronous reset signal input is logic high. Additionally or alternatively, the asynchronous reset signal output is set to logic high when both the start signal output is logic high and the first delayed start signal output is logic low.

In some sets of embodiments, the serial half-duplex start/stop event detection circuit is implemented within a battery powered device.

An embodiment of the present invention will now be described, by way of example only, with reference to the accompanying drawings, in which:

FIG. 3 shows a timing diagram for signals typical of the IIC START/STOP detection circuit shown in FIG. 2.

Figure 1:
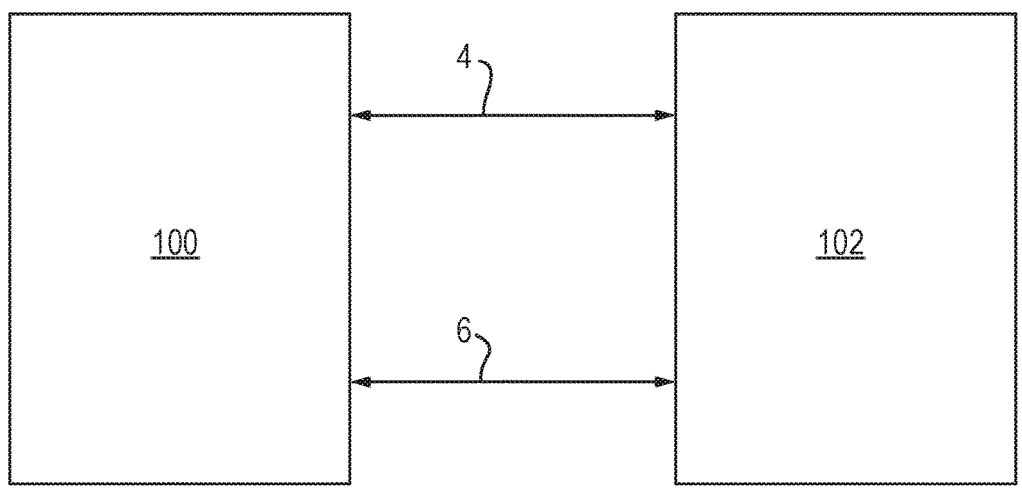
FIG. 1 shows a block diagram of two integrated circuits arranged to communicate via IIC.

FIG. 1 shows a block diagram of two integrated circuits arranged to communicate via IIC. An IIC master device 100 and an IIC slave device 102 are arranged such that they share a two wire interface, comprising a serial clock line 4 and a serial data line 6. Data can be sent via the serial data line 6 in either direction, but only in one direction at a time, i.e. it provides serial, half-duplex communication between the master and slave devices 100, 102.

Figure 2:
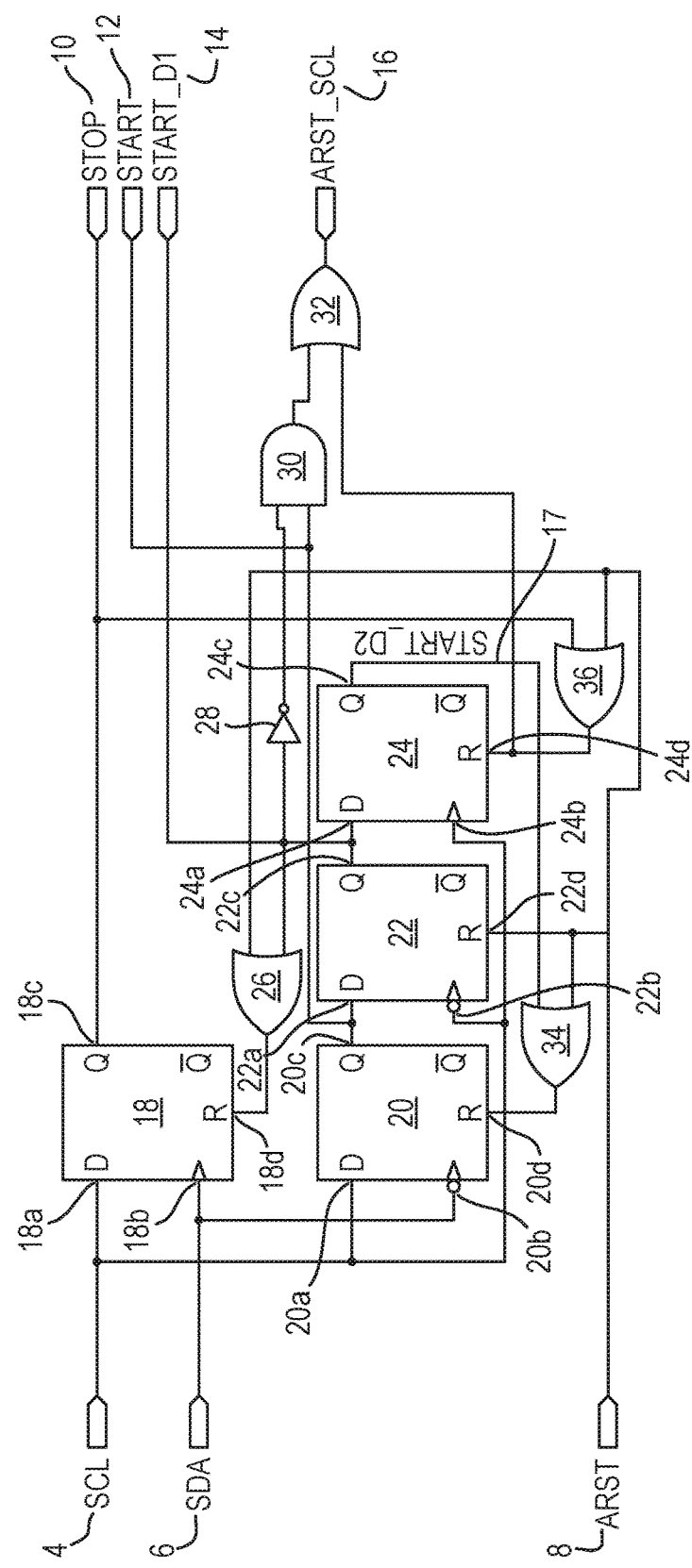
FIG. 2 shows a circuit diagram of an IIC START/STOP detection circuit in accordance with the present invention.

FIG. 2 shows a circuit diagram of a serial, half-duplex start/stop event detection circuit in accordance with the present invention, implemented here as an IIC START/STOP detection circuit 2 within the IIC slave device 102 shown in FIG. 1. In accordance with the IIC protocol, the detection circuit 2 is provided with the serial clock line 4 and the serial data line 6. The detection circuit 2 comprises four flip-flops: a STOP detection flip-flop 18, a START detection flip-flop 20, a first buffer flip-flop 22, and a second buffer flip-flop 24.

The STOP detection flip-flop 18 is arranged such that its data input 18*a* is connected to the serial clock line 4, its clock input 18*b* is connected to the serial data line 6, and it provides a STOP signal output 10 from its output 18*c*.

The START detection flip-flop 20 is arranged such that its data input 20*a* is connected to the serial clock line 4, its clock input 20*b* is connected via an inverter to produce an inverted copy of the serial data line 6, and it provides a START signal output 12 from its output 20*c*.

The first buffer flip-flop 22 is arranged such that its data input 22*a* is connected to the output 20*c* of the START detection flip-flop 20, its clock input 22*b* is connected to an inverter to produce an inverted copy of the serial clock line 4, and it provides a first delayed START signal output, START_D1 14 from its output 22*c*.

The second buffer flip-flop 24 is arranged such that its data input 24*a* is connected to the output 24*c* of the first buffer flip-flop 22, its clock input 24*b* is connected to the serial clock line 4, and it provides a second delayed START signal output, START_D2 17 from its output 24*c*.

An asynchronous reset signal input 8 is also provided to the IIC START/STOP detection circuit 2 and can be used to reset each of the four flip-flops 18, 20, 22, 24 as will be discussed below.

The asynchronous reset input 18*d* of the STOP detection flip-flop 18 is connected to an OR gate 26 that takes the asynchronous reset signal input 8 and START_D1 14 as inputs, such that the STOP detection flip-flop 18 is reset any time that the first delayed START signal output 14 and/or the asynchronous reset signal input 8 are set to logic high.

The asynchronous reset input 20*d* of the START detection flip-flop 20 is connected to an OR gate 34 that takes the asynchronous reset signal input 8 and START_D2 17 as inputs, such that the START detection flip-flop 20 is reset any time that the second delayed START signal output and/or the asynchronous reset signal input are set to logic high.

The asynchronous reset input 22*d* of the first buffer flip-flop 2 is connected directly to the asynchronous reset signal input 8 such that the first buffer flip-flop 22 is reset any time that the asynchronous reset signal input is set to logic high.

The asynchronous reset input 24d of the second buffer flip-flop 24 is connected to an OR gate 36 that takes the asynchronous reset signal input 8 and STOP 10 as inputs, such that the second buffer flip-flop 24 is reset any time that the STOP signal output and/or the asynchronous reset signal input are set to logic high.

The first delayed START signal output 14 is also connected to a NOT gate 28, which inverts START_D1 14 before passing it as an input to an AND gate 30. The AND gate 30 also takes the START signal output 12 and produces an output that is passed as an input to an OR gate 32. The OR gate 32 also takes the signal produced by the OR gate 36 (i.e. the result of the logical OR operation performed on the asynchronous reset signal input 8 and the STOP signal output 10). The output of this OR gate 32 is an asynchronous reset signal output 16 which can be passed to external circuitry to reset other parts of an IIC device.

FIG. 3 shows a timing diagram for signals typical of the IIC START/STOP detection circuit 2 shown in FIG. 2 while in operation. Shown from top to bottom are traces of the asynchronous reset input signal ARST 8, serial clock line SCL 4, serial data line SDA 6, asynchronous reset output signal ARST_SCL 16, first delayed START output signal START_D1 14, second delayed START output signal START_D2 17, START output signal 12, and STOP output signal 10.

At an initial time 50, the asynchronous reset input signal ARST 8 is set from logic high to logic low, allowing the IIC START/STOP detection circuit 2 to operate normally. As the asynchronous reset output signal ARST_SCL 16 is dependent upon ARST 8 through the OR gates 32, 36, ARST_SCL 16 undergoes a negative transition at this time as the other inputs to the OR gates 32, 36 are low.

At a subsequent time 52, a START signal is sent on the IIC bus, transmitted as a negative transition on the serial data line SDA 6 while the serial clock line SCL 4 is logic high. This falling edge of SDA 6 is seen as a rising edge (due to the inverter) on the clock input of the START detection flip-flop 20, causing the logic high on the data input 20a from SCL 4 to be passed to the output 20c, which in turn is the START output signal 12. The circuit has thus detected a START event which is used by the rest of the slave device 102 to indicate that it should begin receiving data on the IIC bus. As START_D1 is logic low at this time, the AND gate 30 produces a logic high output, which in turn drives ARST_SCL 16 high via the OR gate 32.

Shortly thereafter, at time 54, the serial clock line SCL 4 undergoes a negative transition. Due to the inversion, this is taken as a rising edge on the clock input 22b of the first buffer flip-flop 22. This causes the first buffer flip-flop 22 to pass the logic high on the START output signal 12 from its data input 22a to its output 22c as START_D1 14. As START_D1 14 is now logic high, the inverter 28 produces a logic low which causes the output of the AND gate 30 to drop to logic low. As no other input of the OR gate 32 is set to logic high at this point in time, ARST_SCL 16 also drops to logic low. As the STOP output signal 10 is already logic low, the resulting logic high output from OR gate 26 causes no change.

At a subsequent time 56, the next rising edge of the serial clock line SCL 4 occurs and due to it serving as the clock input 24b to the second buffer flip-flop 24, the second buffer flip-flop 24 passes the logic high on START_D1 14 from its data input 24a to its output 24c as START_D2 17. As OR gate 34 now produces a logic high output due to its dependence on START_D2 17. As the output of OR gate 34 is connected to reset input 20d, the START detection flip-flop 20 is reset and the START output signal 12 drops to logic low.

At time 58, the serial clock line SCL 4 drops back to logic low, producing a falling edge, seen as a rising edge by the first buffer flip-flop 22. The first buffer flip-flop 22 then passes the logic low (as START 12 is logic low at this point in time) from its input 22a to its output 22c, causing START_D1 14 to undergo a negative transition.

Subsequently at time 60, serial clock line SCL 4 rises to logic high, producing a rising edge that clocks the second buffer flip-flop 24. The first buffer flip-flop 24 then passes the logic low (as START_D1 14 is logic low at this point in time) from its input 24a to its output 24c, causing START_D2 17 to undergo a negative transition.

After the relevant data has been sent via the IIC bus, at time 62, the serial data line SDA 6 undergoes a positive transition while the serial clock line SCL 4 is held at logic high, signifying a STOP event. The STOP detection flip-flop 18 passes the logic high (from SCL 4) from its data input 18a to its output 18c, causing the STOP output signal 10 to undergo a positive transition. Also, due to the combinational logic formed by OR gate 36 and OR gate 32, the asynchronous output signal ARST_SCL 16 also undergoes a positive transition.

Shortly thereafter at time 64, the serial data line SDA 6 undergoes a negative transition while the serial clock line SCL 4 remains held at logic high. This signifies a START signal, transmitted prior to the next transaction. As previously described hereinbefore, the START detection flip-flop 20 passes the logic high from its data input 20a to its output 20c, driving the START output signal 12 to logic high.

Moments later at time 66 at the next falling edge of the serial clock line SCL 4, START_D1 14 follows and also undergoes a positive transition. The logic high on START_D1 14 drives the output of OR gate 26 to logic high, which resets the STOP detection flip-flop 18, which causes the STOP output signal 10 to logic low.

Thus it will be seen that a serial, half-duplex start/stop event detection circuit which contains only safe constructs, achieved by using buffer flip-flops to ensure that no flip-flop resets its own data source, has been described. Although a particular embodiment has been described in detail, many variations and modifications are possible within the scope of the invention.

The invention claimed is:

1. A serial, half-duplex start/stop event detection circuit for use with a serial, half-duplex communication protocol comprising:
    a serial data input for receiving data signals of said serial, half-duplex communication protocol;
    a serial clock input for receiving clock signals of said serial, half-duplex communication protocol;
    a stop detection flip-flop clocked by the serial data input that takes the serial clock input as a stop data input and generates a stop signal output indicative of a stop event having been detected;
    a start detection flip-flop clocked by an inverted copy of the serial data input that takes the serial clock input as a start data input and generates a start signal output indicative of a start event having been detected;
    a first buffer flip-flop clocked by an inverted copy of the serial clock input that takes the start signal output as a first buffer data input and generates a first delayed start signal output; and
    a second buffer flip-flop clocked by the serial clock input that takes the first delayed start signal output as a second buffer data input and generates a second delayed start signal output, wherein the second delayed start signal output is arranged to reset at least one of said stop detection flip-flop, start detection flip-flop or first buffer flip-flop.

2. The serial, half-duplex start/stop event detection circuit as claimed in claim 1, wherein the start signal output is set to logic high when the serial clock signal is high and the serial data signal transitions from logic high to logic low.

3. The serial, half-duplex start/stop event detection circuit as claimed in claim 1, wherein the stop signal output is set to logic high when the serial clock signal is high and the serial data signal transitions from logic low to logic high.

4. The serial, half-duplex start/stop event detection circuit as claimed in claim 1, wherein the first and second buffer flip-flops are arranged as a shift register.

5. The serial, half-duplex start/stop event detection circuit as claimed in claim 1, wherein the second delayed start signal output resets the start detection flip-flop.

6. The serial, half-duplex start/stop event detection circuit as claimed in claim 1, wherein the first delayed start signal output resets the stop detection flip-flop.

7. The serial, half-duplex start/stop event detection circuit as claimed in claim 1, wherein the stop signal output resets the second buffer flip-flop.

8. The serial, half-duplex start/stop event detection circuit as claimed in claim 1, wherein an asynchronous reset signal input resets at least one of said flip-flops.

9. The serial, half-duplex start/stop event detection circuit as claimed in claim 1, comprising a start reset OR gate having an output connected to an asynchronous reset input of the start detection flip-flop and two inputs connected to the asynchronous reset signal input and the second delayed start signal respectively.

10. The serial, half-duplex start/stop event detection circuit as claimed in claim 1, comprising a stop reset OR gate connected to an asynchronous reset input of the stop detection flip-flop and two inputs connected to the asynchronous reset signal input and the first delayed start signal output respectively.

11. The serial, half-duplex start/stop event detection circuit as claimed in claim 1, comprising a second buffer reset OR gate connected to an asynchronous reset input of the second buffer flip-flop and two inputs connected to the asynchronous reset signal input and the stop signal output respectively.

12. The serial, half-duplex start/stop event detection circuit as claimed in claim 1, wherein the asynchronous reset signal input is connected directly to an asynchronous reset input of the first buffer flip-flop.

13. The serial, half-duplex start/stop event detection circuit as claimed in claim 1, wherein the serial half-duplex start/stop event detection circuit produces an asynchronous reset signal output.

14. The serial, half-duplex start/stop event detection circuit as claimed in claim 1, wherein the asynchronous reset signal output is set to logic high when the stop signal output and/or the asynchronous reset signal input is logic high.

15. The serial, half-duplex start/stop event detection circuit as claimed in claim 1, wherein the asynchronous reset signal output is set to logic high when both the start signal output is logic high and the first delayed start signal output is logic low.

16. The serial, half-duplex start/stop event detection circuit as claimed in claim 1 implemented in an inter-integrated circuit device.

17. The serial, half-duplex start/stop event detection circuit as claimed in claim 1 implemented in a system management bus device.

18. The serial, half-duplex start/stop event detection circuit as claimed in claim 1 implemented within a battery powered device.

* * * * *